(12) United States Patent
Sung et al.

(10) Patent No.: US 11,294,515 B2
(45) Date of Patent: Apr. 5, 2022

(54) FLEXIBLE DISPLAY DEVICE HAVING PROTRUSION PATTERN IN DATA PADS

(71) Applicant: LG Display Co., Ltd., Seoul (KR)

(72) Inventors: Kiyoung Sung, Seoul (KR); SangHo Kim, Paju-si (KR); Eunjin Oh, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/029,515

(22) Filed: Sep. 23, 2020

(65) Prior Publication Data
US 2021/0157426 A1   May 27, 2021

(30) Foreign Application Priority Data
Nov. 27, 2019   (KR) .................. 10-2019-0154491

(51) Int. Cl.
*G06F 3/044* (2006.01)
*G09G 3/00* (2006.01)
*G06F 3/041* (2006.01)
*G09G 3/3233* (2016.01)

(52) U.S. Cl.
CPC ............ *G06F 3/044* (2013.01); *G06F 3/0412* (2013.01); *G06F 3/0416* (2013.01); *G09G 3/035* (2020.08); *G09G 3/3233* (2013.01); *G06F 2203/04102* (2013.01); *G09G 2380/02* (2013.01)

(58) Field of Classification Search
CPC ...... G06F 3/044; G06F 3/0412; G06F 3/0416; G06F 2203/04102; G06F 3/0418; G09G 3/035; G09G 3/3233; G09G 2380/02; G09G 3/3225; G02F 1/13452; G02F 1/13394; H01L 51/0097; H01L 24/17; H01L 24/83; H01L 51/5203; H01L 24/06
See application file for complete search history.

(56) References Cited

U.S. PATENT DOCUMENTS

| | | | |
|---|---|---|---|
| 2002/0105078 A1* | 8/2002 | Lee ..................... | H01L 24/83 257/746 |
| 2002/0105263 A1* | 8/2002 | Kim .................... | G02F 1/13452 313/498 |
| 2007/0045841 A1* | 3/2007 | Cho .................... | H01L 24/17 257/737 |
| 2011/0242476 A1* | 10/2011 | Moriwaki ........... | G02F 1/13394 349/153 |
| 2013/0120329 A1* | 5/2013 | Wang .................. | G02F 1/13452 345/206 |

(Continued)

OTHER PUBLICATIONS

European Search Report dated Apr. 14, 2021 issued in corresponding Patent Application No. 20209193.0 (9 pages).

*Primary Examiner* — Richard J Hong
(74) *Attorney, Agent, or Firm* — Polsinelli PC

(57) ABSTRACT

A flexible display device is provided that includes a display panel having an active area including a plurality of pixels displaying an image and a non-active area surrounding the active area, first data pads disposed in the non-active area adjacent to the active area of the display panel and electrically connected with the plurality of pixels, pads disposed in a direction away from the first data pads and the active area, second data pads disposed between the first data pads and the pads, and a protrusion pattern located between the second data pads and the third data pads and disposed on an upper part of the insulating layer.

23 Claims, 6 Drawing Sheets

(56) References Cited

U.S. PATENT DOCUMENTS

| | | | |
|---|---|---|---|
| 2014/0124803 A1* | 5/2014 | Kwack | H01L 24/06 |
| | | | 257/91 |
| 2015/0230337 A1 | 8/2015 | Kim et al. | |
| 2015/0279792 A1* | 10/2015 | Matsui | G02F 1/13452 |
| | | | 257/737 |
| 2016/0043153 A1* | 2/2016 | Min | H01L 51/0097 |
| | | | 257/40 |
| 2017/0352834 A1* | 12/2017 | Kim | H01L 51/0097 |
| 2018/0102083 A1* | 4/2018 | So | H01L 51/5203 |
| 2019/0096979 A1 | 3/2019 | Jo et al. | |
| 2019/0294273 A1* | 9/2019 | Yoshida | G06F 3/0418 |
| 2019/0326326 A1* | 10/2019 | Seo | G09G 3/3225 |

* cited by examiner

FLEXIBLE DISPLAY DEVICE HAVING PROTRUSION PATTERN IN DATA PADS

CROSS-REFERENCE TO RELATED APPLICATION

This application claims priority from Korean Patent Application No. 10-2019-0154491, filed on Nov. 27, 2019, which is hereby incorporated by reference in its entirety.

BACKGROUND

Field of the Disclosure

The present disclosure relates to a flexible display device, and more particularly, to a flexible display device in which durability of a data pad portion disposed in a non-display area is improved.

Description of the Background

Various display devices used for multimedia devices, such as televisions, cellular phones, tablet computers, navigation units, or game machines, are currently being developed. Such a display device includes a display module, and the display module includes a display panel and a drive circuit. The drive circuit is configured to supply a data signal to the display panel.

When the drive circuit is mounted on the display panel, predetermined heat and pressure are applied. In this process, a part of the display panel is bent so that the display panel is brought into contact with the ends of the drive circuit rather than input/output bumps of the drive circuit. Therefore, short circuits may occur. As a result, the display device may have defects.

SUMMARY

Accordingly, the present disclosure is to suppress defects of a display device caused by short circuits between a display panel and the ends of a drive circuit when the display panel is bent.

The present disclosure is not limited to the above-mentioned feature or features that are not mentioned above, can be clearly understood by those skilled in the art from the following descriptions.

According to an aspect of the present disclosure, a flexible display device includes: a display panel having an active area including a plurality of pixels displaying an image and a non-active area surrounding the active area. The flexible display device also includes first data pads disposed in the non-active area adjacent to the active area of the display panel and electrically connected with the plurality of pixels. Further, the flexible display device includes pads disposed in a direction away from the first data pads and the active area and second data pads which are disposed between the first data pads and the pads.

The second data pads and the pads are connected with each other through connection lines, respectively. An insulating layer may be disposed to cover an upper part of the display panel and a part of the first data pads, the second data pads and the pads. The flexible display device may include a protrusion pattern located between the second data pads and the pads and disposed on the upper part of the insulating layer.

Other detailed matters of the exemplary aspects are included in the detailed description and the drawings.

According to the present disclosure, even when the display panel is bent, it is possible to suppress short circuits between the display panel and the ends of a drive circuit.

Accordingly, no short circuit occurs between display panel and the ends of the drive circuit, thereby suppressing the flow of an overcurrent in the display panel.

Also, according to the present disclosure, it is possible to suppress the degradation of display quality caused by the flow of an overcurrent in the display panel. Therefore, the durability of the display device can be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
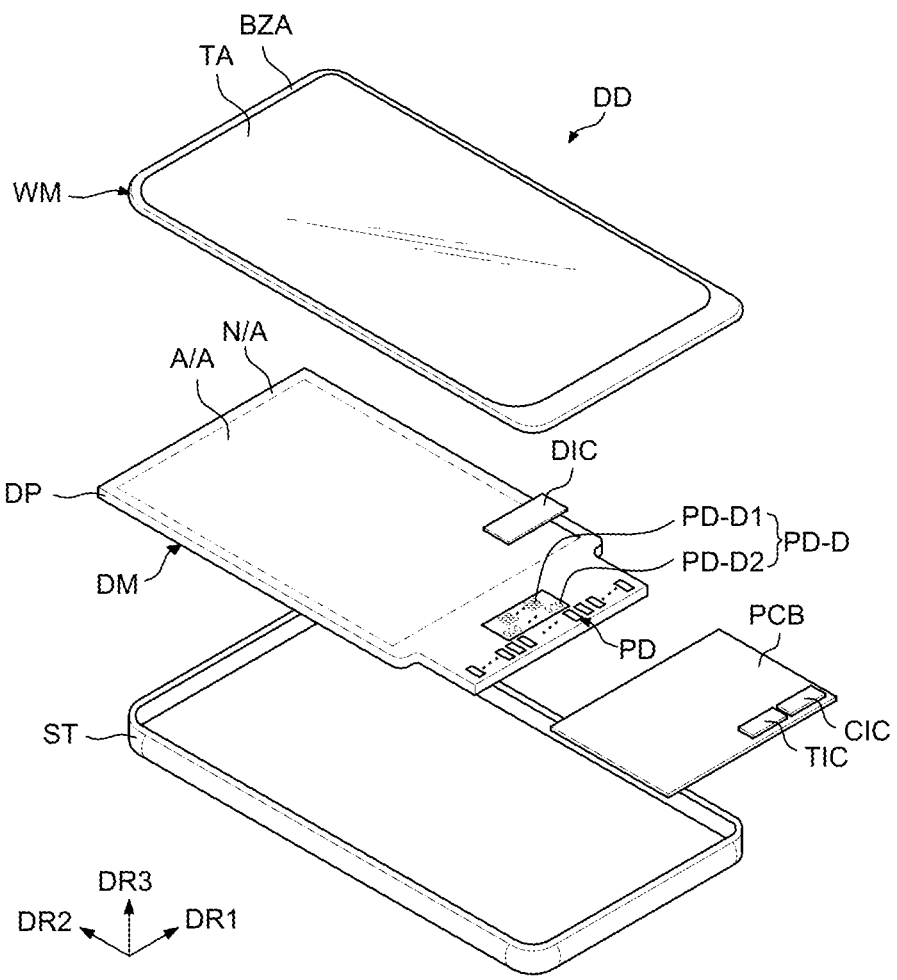
FIG. 1 is an exploded perspective view schematically illustrating a flexible display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, exemplary aspects of the present disclosure will be described in detail with reference to accompanying drawings.

Figure 2:
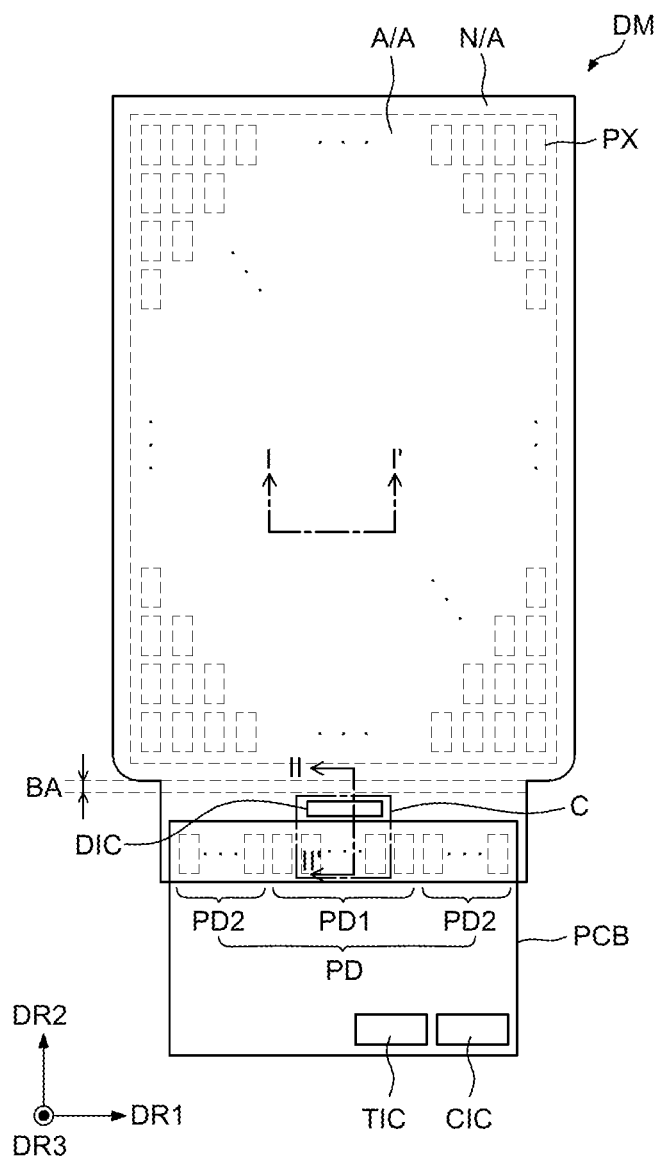
FIG. 2 is a plan view schematically illustrating a display module according to an exemplary aspect of the present disclosure.

FIG. 1 is an exploded perspective view illustrating a flexible display device according to an exemplary aspect of the present disclosure. FIG. 2 is a plan view illustrating a display module DM.

Referring to FIG. 1, a display device DD may include a window member WM, a display module DM and a set member ST.

The window member WM may be divided into a transmission area TA and a bezel area BZA.

The transmission area TA may transmit light incident thereto. Specifically, an image IM generated by the display module DM may be visible to a user through the transmission area TA.

The bezel area BZA may be adjacent to the transmission area TA. Specifically, the bezel area BZA may surround the transmission area TA. In an exemplary aspect of the present disclosure, the bezel area BZA may have a predetermined color. The bezel area BZA may overlap a non-display area N/A.

The display module DM may be disposed under the window member WM. The display module DM can be protected by the window member WM against an external impact or the like.

The display module DM may be divided into an active area A/A and the non-active area N/A. The active area A/A corresponds to the transmission area TA of FIG. 1 and may display the image IM and sense the user's touch thereon.

The non-active area N/A corresponds to the bezel area BZA. In the non-active area N/A, wiring lines for supplying electrical signals to the active area A/A or receiving electrical signals from the active area A/A may be disposed.

The display module DM may include a display panel DP, an input sensing circuit, a drive circuit DIC, a printed circuit board PCB, an input sensing drive circuit TIC and a control circuit CIC.

The display panel DP may include a plurality of pixels PX, a plurality of data pads PD-D and a plurality of pads PD.

The pixels PX may be disposed overlapping the active area A/A. The data pads PD-D and the pads PD may be disposed overlapping the non-active area N/A.

The data pads PD-D may include a plurality of first data pads PD-D1 and a plurality of second data pads PD-D2. In an exemplary aspect of the present disclosure, the number of the first data pads PD-D1 may be greater than that of the second data pads PD-D2.

The first data pads PD-D1 may be disposed in a first direction DR1. In an exemplary aspect of the present disclosure, the first data pads PD-D1 may be disposed in a matrix form. FIG. 2 illustrates an example where the first data pads PD-D1 are disposed in three rows, but the present disclosure is not limited thereto.

The second data pads PD-D2 may be disposed in the first direction DR1. The first data pads PD-D1 and the second data pads PD-D2 may be disposed apart from each other in a second direction DR2.

The first data pads PD-D1 may be electrically connected with the pixels PX. The first data pads PD-D1 and the second data pads PD-D2 may be electrically connected with the drive circuit DIC.

The pads PD may include a plurality of first pads PD1 and a plurality of second pads PD2.

The first pads PD1 may transmit electrical signals to the pixels PX through the drive circuit DIC.

The second pads PD2 may be electrically connected with the input sensing circuit.

The input sensing circuit may be disposed on the display panel DP.

The input sensing circuit may include a plurality of first sensor electrodes and a plurality of second sensor electrodes.

Each of the first sensor electrodes and the second sensor electrodes may contain a metal material. For example, each of the first sensor electrodes and the second sensor electrodes may contain indium tin oxide, indium zinc oxide, indium gallium zinc oxide, or zinc oxide (ZnO), but is not limited thereto. Each of the first sensor electrodes and the second sensor electrodes may contain molybdenum (Mo) or copper (Cu).

An electrostatic capacitance may be generated between the first sensor electrodes and the second sensor electrodes. When a user touches the active area A/A, the electrostatic capacitance between the first sensor electrodes and the second sensor electrodes may be changed. The input sensing drive circuit TIC may sense a change in the electrostatic capacitance between the first sensor electrodes and the second sensor electrodes to determine which portion of the active area A/A has been touched by the user.

The drive circuit DIC may be disposed overlapping the data pads PD-D. The drive circuit DIC may be electrically connected with the pixels PX in the active area A/A and may supply data signals to the pixels PX.

The printed circuit board PCB may be electrically connected with the pads PD. The input sensing drive circuit TIC and the control circuit CIC may be mounted on the printed circuit board PCB.

The input sensing drive circuit TIC may sense a change in the electrostatic capacitance between the first sensor electrodes and the second sensor electrodes by means of the second pads PD2. Thus, the input sensing drive circuit TIC may sense the user's touch applied to the active area A/A.

The control circuit CIC may be configured to control at least any one of the drive circuit DIC and the input sensing drive circuit TIC.

In an exemplary aspect of the present disclosure, a part (i.e., a bending area BA) of the display module DM may be bent. Thus, the non-display area N/A of the display device DD may be reduced.

At least a part of the set member ST may be disposed under the display module DM. The set member ST may accommodate the window member WM and the display module DM.

Figure 3:
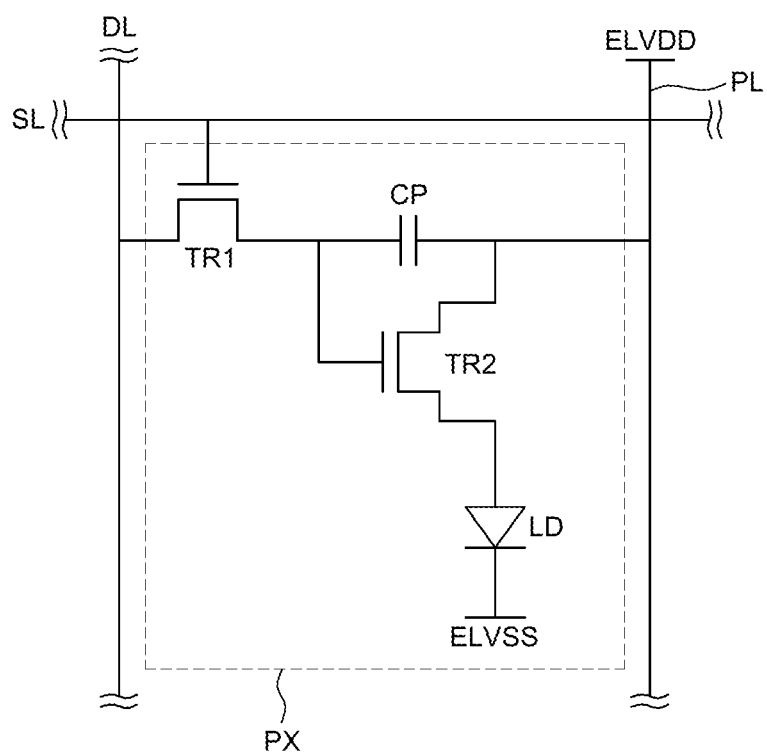
FIG. 3 schematically illustrates an equivalent circuit of a pixel according to an exemplary aspect of the present disclosure.

FIG. 3 illustrates an example of an equivalent circuit of a pixel PX according to an exemplary aspect of the present disclosure.

Each pixel PX includes transistors TR1 and TR2, a capacitor CP and a light emitting element LD. In the present exemplary aspect, a pixel PX including two transistors TR1 and TR2 and one capacitor CP is described as an example, but the configuration of the pixel PX is not limited thereto.

An anode electrode of the light emitting element LD receives a first power voltage ELVDD applied to a power line PL through a second transistor TR2. A cathode electrode of the light emitting element LD receives a second power voltage ELVSS. A first transistor TR1 outputs a data signal applied to a data line DL in response to a scan signal applied to a scan line SL. The capacitor CP is charged with a voltage corresponding to the data signal received from the first transistor TR1. The second transistor TR2 controls a current flowing in the light emitting element LD according to the voltage stored in the capacitor CP.

Figure 4:
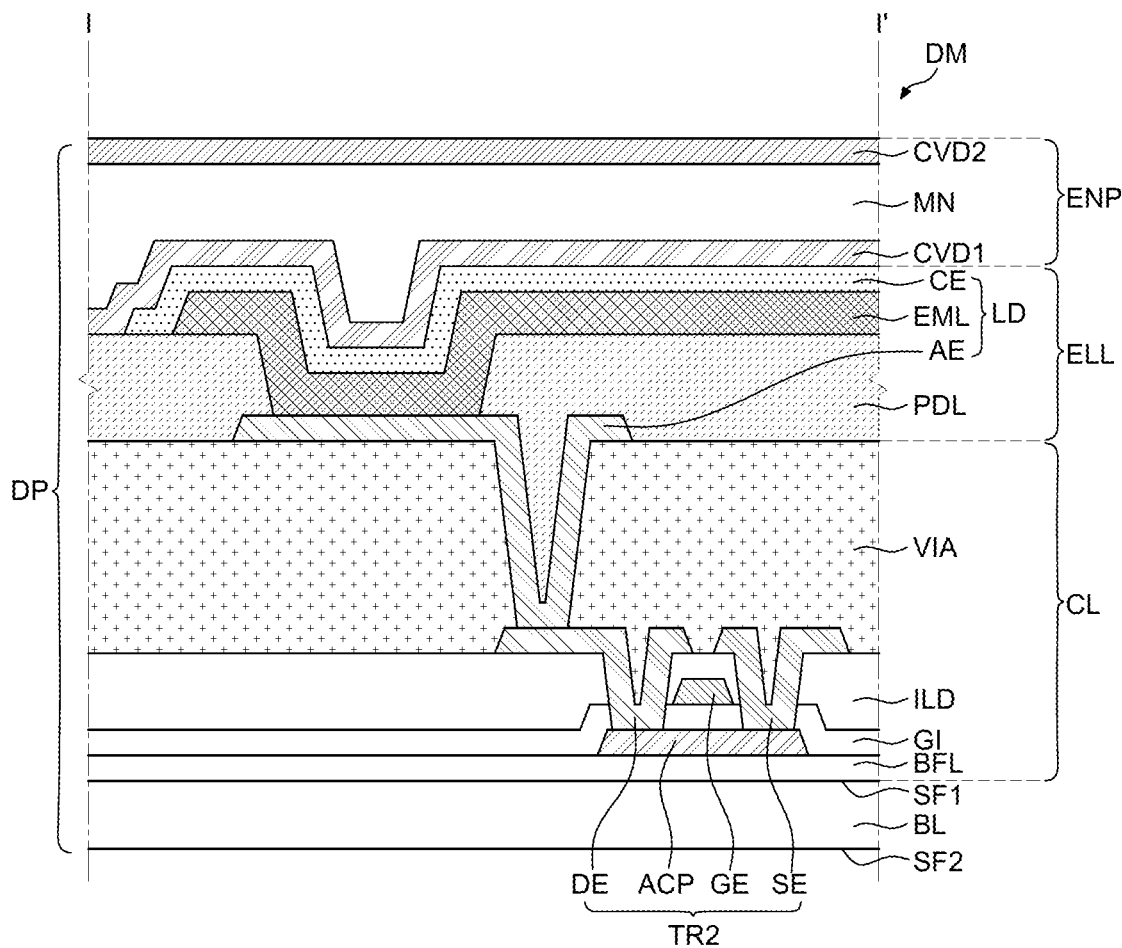
FIG. 4 is a cross-sectional view as taken along line I-I' of FIG. 2.

FIG. 4 illustrates a part of a cross-sectional view as taken along line I-I' of FIG. 2.

The display panel DP may include a base layer BL, a circuit layer CL, a light emitting element layer ELL and an encapsulation layer ENP.

The base layer BL may contain synthetic resins. Specifically, the base layer BL may contain polyimide (PI), but is not limited thereto.

The base layer BL may include a first surface SF1 and a second surface SF2. The first surface SF1 may face the second surface SF2. The first surface SF1 may be disposed closer to the transistors TR1 and TR2 than the second surface SF2.

The circuit layer CL is disposed on the base layer BL. The circuit layer CL may include the transistors TR1 and TR2, the capacitor CP, a plurality of lines SL, DL and PL electrically connected with the transistors TR1 and TR2, a buffer layer BFL, a gate insulating layer GI, an interlayer insulating layer ILD and a via layer VIA.

Each of the transistors TR1 and TR2 may include an activation pattern ACP, a control electrode GE, an input electrode SE and an output electrode DE.

The activation pattern ACP may contain polysilicon, amorphous silicon or metal oxide semiconductor, but is not limited thereto. The control electrode GE may contain molybdenum (Mo), but is not limited thereto. Each of the input electrode SE and the output electrode DE may contain at least any one of aluminum (Al) and titanium (Ti), but is not limited thereto. In an exemplary aspect of the present disclosure, each of the input electrode SE and the output electrode DE may have a structure in which titanium (Ti), aluminum (Al) and titanium (Ti) are sequentially laminated.

The buffer layer BFL may be disposed on the base layer BL. The buffer layer BFL may suppress the diffusion of impurities present in the base layer BL to the pixel PX. Particularly, the buffer layer BFL suppresses the diffusion of the impurities to the activation pattern ACP of the transistors TR1 and TR2 included in the pixel PX.

The impurities may be introduced from the outside or generated by thermal decomposition of the base layer BL. The impurities may be sodium or gas discharged from the base layer BL. Further, the buffer layer BFL may block moisture from being introduced into the pixel PX from the outside.

The gate insulating layer GI may be disposed on the buffer layer BFL and may cover the activation pattern ACP.

The interlayer insulating layer ILD may be disposed on the gate insulating layer GI and may cover the control electrode GE.

The via layer VIA may be disposed on the interlayer insulating layer ILD and may cover the input electrode SE and the output electrode DE.

In an exemplary aspect of the present disclosure, each of the gate insulating layer GI and the interlayer insulating layer ILD may contain silicon nitride or silicon oxide.

In an exemplary aspect of the present disclosure, the via layer VIA may contain an organic material and/or an inorganic material.

The light emitting element layer ELL may include the light emitting element LD and a pixel definition layer PDL. The light emitting element LD may include an anode electrode AE, an emission layer EML and a cathode electrode CE.

The anode electrode AE may be disposed on the via layer VIA. The anode electrode AE may be electrically connected with the output electrode DE through a contact hole.

The pixel definition layer PDL may be disposed on the via layer VIA and may expose at least a part of the anode electrode AE. The pixel definition layer PDL may contain an organic material and/or an inorganic material.

The emission layer EML may be disposed on the anode electrode AE.

If the light emitting element LD is an organic light emitting diode (OLED), the emission layer EML may contain an organic material. In another exemplary aspect of the present disclosure, if the light emitting element LD is a micro LED, the emission layer EML may contain an inorganic material.

The cathode electrode CE may be disposed on the emission layer EML.

The encapsulation layer ENP may include a first inorganic layer CVD1, an organic layer MN and a second inorganic layer CVD2. FIG. 5 illustrates an example where the encapsulation layer ENP includes two inorganic layers and one organic layer, but is not limited thereto. For example, the encapsulation layer ENP may include three inorganic layers and two organic layers, and in this case, the inorganic layers and the organic layers may be alternately laminated.

Figure 5A:
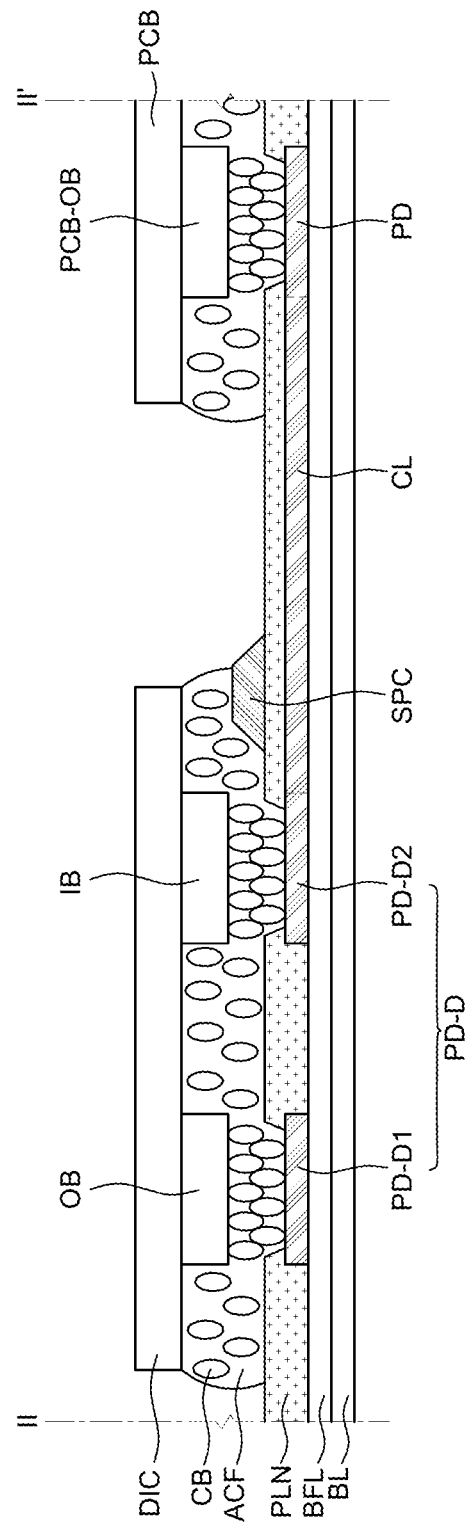
FIG. 5A is a cross-sectional view as taken along line II-II' of FIG. 2.
Figure 5B:
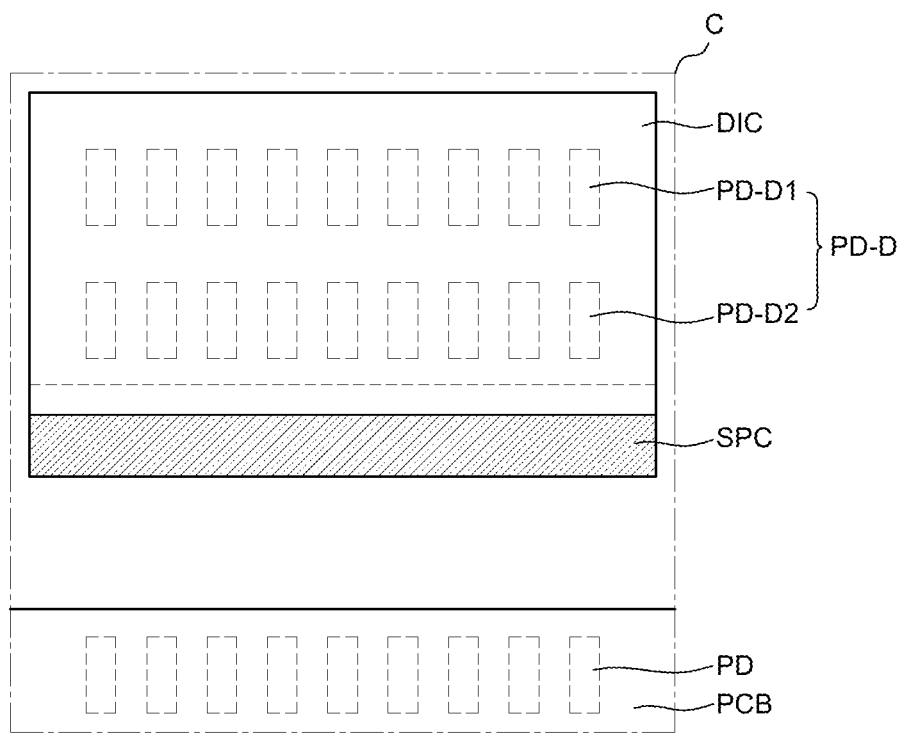
FIG. 5B is a plan view schematically illustrating area C of FIG. 2.

FIG. 5A is a cross-sectional view as taken along line II-II' of FIG. 2, and FIG. 5B is an enlarged plan view schematically illustrating area C of FIG. 2.

A flexible display device may include the display panel DP having the active area A/A including a plurality of pixels PX displaying an image and the non-active area N/A surrounding the active area A/A. The flexible display device may also include the first data pads PD-D1 disposed in the non-active area N/A adjacent to the active area A/A of the display panel DP and electrically connected with the plurality of pixels PX. The flexible display device may further include the pads PD disposed in a direction away from the first data pads PD-D1 and the active area A/A and the second data pads PD-D2 between the first data pads PD-D1 and the pads PD.

The second data pads PD-D2 and the pads PD are connected with each other through connection lines CL, respectively.

An insulating layer PLN may be disposed to cover an upper part of the display panel DP and a part of the first data pads PD-D1, the second data pads PD-D2 and the pads PD. The flexible display device may include a protrusion pattern SPC located between the second data pads PD-D2 and the pads PD and disposed on the upper part of the insulating layer PLN.

The printed circuit board PCB configured to transmit image data to the display panel DP may be electrically connected with the pads PD.

The flexible display device may further include the drive circuit DIC configured to generate a data signal using the image data transmitted from the printed circuit board PCB and output the generated data signal to the display panel DP. The flexible display device may also include input bumps IB connected with the drive circuit DIC and configured to receive the image data and output bumps OB connected with the drive circuit DIC and configured to output the image data to the display panel DP. The output bumps OB may be electrically connected with the first data pads PD-D1, respectively, and the input bumps IB may be electrically connected with the second data pads PD-D2, respectively.

The protrusion pattern SPC may be disposed overlapping the ends of the drive circuit DIC in a direction toward the input bumps IB. The protrusion pattern SPC may be the same layer as the pixel definition layer PDL illustrated in FIG. 4. The protrusion pattern SPC may be disposed on the upper part of the insulating layer PLN and in direct contact with the insulating layer PLN.

As described above, when the drive circuit DIC is mounted on the display panel DP, an adhesive member ACF is interposed between the drive circuit DIC and the display panel DP and heat and pressure are applied thereto. In this process, the display panel DP is bent and a space between the end on one side of the drive circuit DIC and the display panel DP becomes narrow. In the narrow space, conductive balls CB contained in the adhesive member ACF are aggregated and the insulating layer PLN of the display panel DP is broken. Thus, short circuits occur in the drive circuit DIC and the connection lines CL under the insulating layer. As described above, bending of the panel occurs at one end of the drive circuit DIC closer to the end of the display panel DP among both ends of the drive circuit DIC.

The protrusion pattern SPC may suppress the aggregation of the conductive balls CB when the display panel DP is bent and the distance from the drive circuit DIC becomes narrow. Also, even if the conductive balls CB are aggregated, the protrusion pattern SPC can suppress the penetration of the conductive balls CB through the insulating layer PLN. To this end, the protrusion pattern SPC may be formed of the insulating layer PLN and may contain an organic material and/or an inorganic material. The height of the protrusion pattern SPC is formed lower than those of the input bumps IB. This is to suppress the interference of the protrusion pattern SPC when the drive circuit DIC is bonded to the display panel.

The protrusion pattern SPC may have a bar shape extended in a long-side direction of the drive circuit DIC and connected as one body, but is not limited thereto. The protrusion pattern SPC may be formed into a plurality of bars apart from each other.

In another exemplary aspect of the present disclosure, a flexible display device may include the display panel DP having the active area A/A including a plurality of pixels PX displaying an image and the non-active area N/A surrounding the active area A/A. The flexible display device may also include the printed circuit board PCB configured to transmit image data to the display panel DP. The flexible display device may further include the drive circuit DIC configured to generate a data signal using the image data transmitted from the printed circuit board PCB and output the generated data signal to the display panel DP.

In the drive circuit DIC, the input bumps IB may be disposed to receive the image data and the output bumps OB may be disposed to output the image data to the display panel DP. The flexible display device may also include the first data pads PD-D1 disposed in the non-active area N/A adjacent to the display area of the display panel DP and electrically connected with the output bumps OB. The pads PD may be disposed under and electrically connected with the printed circuit board PCB. The second data pads PD-D2 may be located between the first data pads PD-D1 and the pads PD and electrically connected with the input bumps IB connected to a drive circuit. The second data pads PD-D2 and the pads PD are connected with each other through the connection lines CL, respectively.

The insulating layer PLN may expose upper surfaces of the first data pads PD-D1, the second data pads PD-D2 and the pads PD and cover an upper part of the connection lines CL. The insulating layer PLN may have various forms. For example, the insulating layer PLN may be formed as an organic insulating film of benzocyclobutene (BCB) or acryl or an inorganic insulating film such as a silicon nitride film (SiNx) or a silicon oxide film (SiOx). Otherwise, the insulating layer PLN may have a single-layered structure or a double-layered or multi-layered structure. The insulating layer PLN may be the same layer as the via layer VIA illustrated in FIG. 4. That is, the insulating layer PLN may contain an organic material and/or an inorganic material.

The adhesive member ACF may be interposed between the drive circuit DIC and the display panel DP to connect the input bumps IB with the second data pads PD-D2 and the output bumps OB with the first data pads PD-D1. The adhesive member ACF may contain the conductive balls CB.

The flexible display device may further include the protrusion pattern SPC. This is to suppress short circuits between the ends of the drive circuit DIC in a direction toward the input bumps IB and the connection lines CL connecting the second data pads PD-D2 and the pads PD when pressure is applied to bond the drive circuit DIC to the display panel DP. The protrusion pattern SPC may suppress the aggregation of the conductive balls CB at the ends of the drive circuit DIC when pressure is applied to bond the drive circuit DIC to the display panel DP. Since the conductive balls CB are not aggregated, the ends of the drive circuit DIC are not in contact with the connection lines CL. Thus, it is possible to suppress short circuits. Even if the conductive balls CB are aggregated at the ends of the drive circuit DIC, the conductive balls CB cannot penetrate through the insulating layer PLN due to the thickness of the protrusion pattern SPC. Therefore, short circuits do not occur between the ends of the drive circuit DIC and the connection lines CL.

The protrusion pattern SPC may be the same layer as the pixel definition layer PDL illustrated in FIG. 4. That is, the protrusion pattern SPC may contain an organic material and/or an inorganic material. The protrusion pattern SPC may be disposed on the upper part of the insulating layer PLN and in direct contact with the insulating layer PLN. The height of the protrusion pattern SPC is formed lower than those of the input bumps IB. This is to suppress the interference of the protrusion pattern SPC when the drive circuit DIC is bonded to the display panel.

The protrusion pattern SPC may have a bar shape extended in a long-side direction of the drive circuit DIC and connected as one body, but is not limited thereto. The protrusion pattern SPC may be formed into a plurality of bars apart from each other.

The flexible display device according to an exemplary aspect of the present disclosure includes a protrusion pattern on an upper part of an insulating layer on a display panel so as to overlap the ends of a drive circuit. Therefore, even when the display panel is bent, it is possible to suppress short circuits between the display panel and the ends of the drive circuit.

Further, since no short circuit occurs between display panel and the ends of the drive circuit, it is possible to suppress the flow of an overcurrent in the display panel. Also, it is possible to suppress the degradation of display quality caused by the flow of an overcurrent in the display panel. Therefore, the durability of the flexible display device can be improved.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display device, comprising:
   a display panel having an active area including a plurality of pixels displaying an image and a non-active area surrounding the active area;
   first data pads disposed in the non-active area adjacent to the active area of the display panel and electrically connected with the plurality of pixels;
   third data pads disposed in the non-active area and positioned a direction away from the first data pads and the active area;
   second data pads disposed in the non-active area and located between the first data pads and the third data pads;
   connection lines connecting the second data pads and the third data pads and disposed in the non-active area;
   an insulating layer covering an upper part of the display panel and parts of the first data pads, the second data pads and the third data pads;
   a protrusion pattern located between the second data pads and the third data pads and disposed on an upper part of the insulating layer;
   a printed circuit board electrically connected with the third data pads and configured to transmit image data corresponding to the image to the display panel; and
   a drive circuit configured to generate a data signal using the image data transmitted from the printed circuit board and output the generated data signal to the display panel,
   wherein the third data pads are disposed to be farther apart from the active area than the second data pads, and the second data pads are disposed to be farther apart from the active area than the first data pads,
   wherein the protrusion pattern overlaps with the connection lines, and
   wherein the protrusion pattern overlaps with a lower portion of the end of the drive circuit.

2. The flexible display device according to claim 1, further comprising:
   input bumps connected with the drive circuit and configured to receive the image data; and
   output bumps connected with the drive circuit and configured to output the image data to the display panel.

3. The flexible display device according to claim 2, wherein the output bumps are electrically connected with the first data pads, and the input bumps are electrically connected with the second data pads.

4. The flexible display device according to claim 2, wherein the protrusion pattern has a height lower than those of the input bumps.

5. The flexible display device according to claim 2, further comprising an adhesive member connecting the input bumps with the second data pads and the output bumps with the first data pads, wherein the adhesive member contains conductive balls.

6. The flexible display device according to claim 1, wherein the protrusion pattern is in direct contact with the insulating layer.

7. The flexible display device according to claim 1, wherein the protrusion pattern includes an organic material or an inorganic material.

8. The flexible display device according to claim 1, wherein the protrusion pattern has a bar shape extended in a long-side direction of the drive circuit and connected as one body.

9. The flexible display device according to claim 1, wherein the protrusion pattern has a bar shape extended in a long-side direction of the drive circuit and having at least one cut portion.

10. The flexible display device according to claim 1, further comprising:
    a window member disposed above the display panel and including a transmission area corresponding to the active area of the display panel and a bezel area corresponding to the non-active area of the display panel; and
    a set member disposed under the display panel and accommodating the window member and the display panel.

11. The flexible display device according to claim 1, wherein the number of the first data pads is greater than that of the second data pads.

12. A flexible display device, comprising:
    a display panel having an active area including a plurality of pixels displaying an image and a non-active area surrounding the active area;
    a printed circuit board configured to transmit image data corresponding to the image to the display panel;
    a drive circuit configured to generate a data signal using the image data transmitted from the printed circuit board and output the generated data signal to the display panel;
    input bumps connected with the drive circuit and configured to receive the image data; and
    output bumps connected with the drive circuit and configured to output the image data to the display panel;

first data pads disposed in the non-active area adjacent to the active area of the display panel and electrically connected with the output bumps;

third data pads disposed in the non-active area and electrically connected with the printed circuit board;

second data pads disposed in the non-active area and located between the first data pads and the third data pads and electrically connected with the input bumps;

an insulating layer exposing upper surfaces of the first data pads, the second data pads and the third data pads;

connection lines connecting the second data pads and the third data pads and disposed in the non-active area;

an adhesive member connecting the input bumps with the second data pads and the output bumps with the first data pads; and a protrusion pattern configured to suppress short circuits between the ends of the drive circuit and the display panel when pressure is applied to bond the drive circuit to the display panel, wherein the third data pads are disposed to be farther apart from the active area than the second data pads, and the second data pads are disposed to be farther apart from the active area than the first data pads, wherein the protrusion pattern overlaps with the connection lines, and wherein the protrusion pattern overlaps with a lower portion of the end of the drive circuit.

13. The flexible display device according to claim 12, wherein the adhesive member is interposed between the drive circuit and the display panel.

14. The flexible display device according to claim 13, wherein the adhesive member contains conductive balls.

15. The flexible display device according to claim 14, wherein the protrusion pattern suppresses the aggregation of the conductive balls at the ends of the drive circuit when pressure is applied to bond the drive circuit to the display panel.

16. The flexible display device according to claim 14, wherein the protrusion pattern suppresses the penetration of the conductive balls through the insulating layer when pressure is applied to bond the drive circuit to the display panel.

17. The flexible display device according to claim 12, wherein the protrusion pattern includes an organic material or an inorganic material and is in direct contact with the insulating layer.

18. The flexible display device according to claim 17, wherein a height of the protrusion pattern is lower than those of the input bumps.

19. The flexible display device according to claim 17, wherein the protrusion pattern has a bar shape extended in a long-side direction of the drive circuit and connected as one body.

20. The flexible display device according to claim 17, wherein the protrusion pattern has a bar shape extended in a long-side direction of the drive circuit and having at least one cut portion.

21. The flexible display device according to claim 12, wherein the protrusion pattern is separated apart from the second data pads.

22. The flexible display device according to claim 12, further comprising:

a window member disposed above the display panel and including a transmission area corresponding to the active area of the display panel and a bezel area corresponding to the non-active area of the display panel; and a set member disposed under the display panel and accommodating the window member and the display panel.

23. The flexible display device according to claim 12, wherein the number of the first data pads is greater than that of the second data pads.

* * * * *